United States Patent [19]

Chung et al.

[11] Patent Number: 4,929,918
[45] Date of Patent: May 29, 1990

[54] SETTING AND DYNAMICALLY ADJUSTING VCO FREE-RUNNING FREQUENCY AT SYSTEM LEVEL

[75] Inventors: Paul W. Chung; Ralph L. Gee, both of San Jose; Luke C. K. Lang, Santa Clara; Paik Saber, San Jose, all of Calif.

[73] Assignee: International Business Machines Corporation, Armonk, N.Y.

[21] Appl. No.: 363,566

[22] Filed: Jun. 7, 1989

[51] Int. Cl.$^5$ .................................. H03L 7/113
[52] U.S. Cl. ................................. 331/10; 331/1 A; 331/25
[58] Field of Search .................. 331/1 A, 10, 14, 17, 331/25

[56] References Cited

U.S. PATENT DOCUMENTS

| | | | |
|---|---|---|---|
| 3,651,422 | 3/1972 | Underhill | 311/1 A |
| 4,380,742 | 4/1983 | Hart | 331/1 A |
| 4,528,523 | 7/1985 | Crowley | 331/10 |
| 4,543,661 | 9/1985 | Defeuilly et al. | 455/76 |
| 4,654,604 | 3/1987 | Smith et al. | 331/1 A |
| 4,672,447 | 6/1987 | Möring et al. | 358/148 |

Primary Examiner—David Mis
Attorney, Agent, or Firm—Henry E. Otto, Jr.

[57] ABSTRACT

A method and means for setting the free-running frequency of a voltage controlled oscillator (VCO) without requiring laser trimming or the like is described. The VCO forms part of an interconnected phase-locked loop (PLL) and frequency-locked loop (FLL). At system power on, the PLL is automatically disabled and a digital-to-analog (DAC) in the PLL is set to a value corresponding substantially to the center of a preselected lock range. The FLL, which includes a second DAC, then operates to generate a bias voltage for incrementing or decrementing the VCO output frequency until the VCO pulse count stored in a register equals an expected count; whereupon the VCO will be set at its free-running frequency. When the PLL is enabled, a phase error generator generates a digital phase error signal from the input data. A digital integrator converts the phase error signal to a digital frequency error signal. These error signals are added and the result is supplied to the DAC in the PLL for providing an analog output indicative of PLL frequency error. The outputs from both DACs are summed and the resultant current is converted to a bias voltage to adjust the VCO frequency as necessary for normally maintaining it within said lock range. If the VCO frequency deviates from said range, the frequency error signal to the PLL DAC is zeroed, and the frequency error signal is supplied to the FLL DAC. The phase error signal from the PLL DAC and the signal from the FLL DAC as modified by the frequency error signal are summed, and the resultant current in converted to a bias voltage to adjust the VCO frequency to within said lock range.

13 Claims, 1 Drawing Sheet

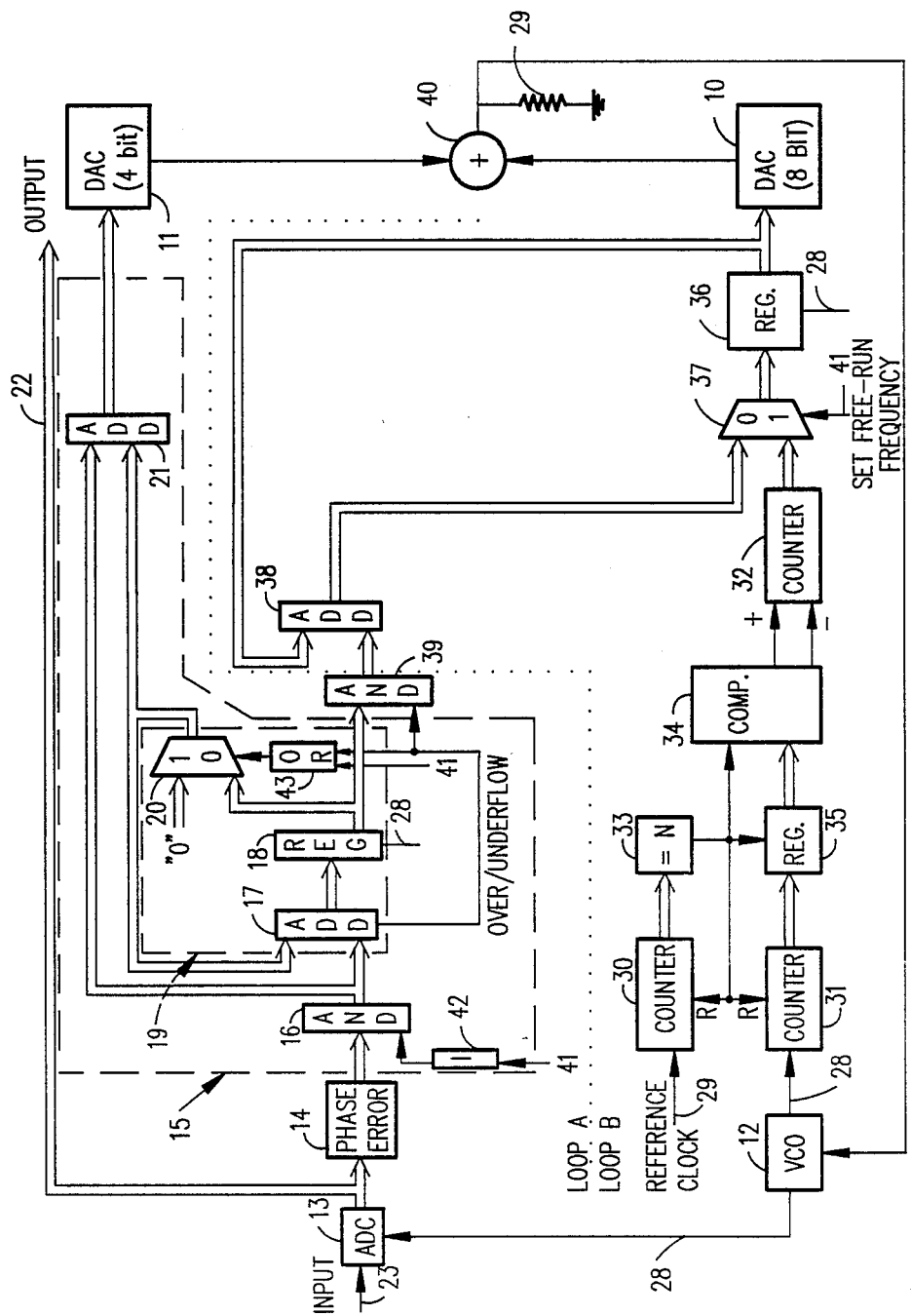

SETTING AND DYNAMICALLY ADJUSTING VCO FREE-RUNNING FREQUENCY AT SYSTEM LEVEL

TECHNICAL FIELD

This invention relates to a method and means for setting at the system level the free-running frequency of a voltage controlled oscillator (VCO) in a phase-locked loop (PLL) without requiring laser trimming or the like and thereafter dynamically adjusting said frequency if and when the correction range capability of the PLL is exceeded.

BACKGROUND OF THE INVENTION

Currently all PLLs, except the all-digitally-implemented PLLs, utilize a VCO to provide the clocking means. A VCO is employed, for example, for this purpose in the design of a magnetic recording channel.

A major problem in the design of PLLS is assuring a very tight tolerance for the free-running frequency of the VCO. To achieve this, temperature compensation techniques are often incorporated into the design of the VCO circuitry. However, since the variations in process parameters (such as oxide thickness, threshold voltage, etc.) are statistically independent of each other, the effect on the circuit cannot be fully overcome using design techniques. The VCO free-running frequency can have as much as 30%-50% variation from chip to chip. However, for a PLL to function correctly it is essential that the free-running frequency tolerance be very tight and not vary more than 1%-2%.

Heretofore, the chip-to-chip variation in VCO free-running frequency was resolved by physically modifying the PLL chip by using (1) a laser trim technique involving trimming resistors or capacitors which are on the module substrate and connected to the VCO circuit inside the chip; or (2) a high current zapping technique to blow out resistors on the chip at the wafer level. Both of these techniques are expensive and time consuming, and the high current zapping technique is unreliable for the tight tolerances required for a VCO.

U.S. Pat. No. 4,380,742 describes a circuit for synchronizing the frequency and/or phase of an output frequency signal to reference frequency signal. This phase-locked or frequency locked circuit comprises an oscillator the components of which must be trimmed, as in the prior art. There is no teaching of a combination PLL and FLL circuit which (1) permits setting of VCO free-running frequency without laser trimming, and (2) dynamically adjusts the free-running frequency, if and when the phase error in a PLL as converted to a frequency error by a digital integrator, exceeds the correction range capability of the PLL.

Other frequency synthesizing circuits are described in U.S. Pat. Nos. 4,654,604; 4,672,477; 3,651,422 and 4,543,661. None enable elimination of laser trimming or provide dynamic adjustment of VCO free-running frequency.

There is a need for a method and means for setting the VCO free-running frequency to compensate for different performance characteristics due to process variations and for eliminating the costly laser trimming technique currently used, for example, to set the VCO free-running frequency in a PLL of a magnetic recording channel. In addition, it would be desirable that such a method and means permit frequency to be adjusted dynamically at the system level to compensate for variations in temperature, power supply, drift of components due to aging, or other factors. Such a method and means should also desirably permit the free-running frequency to be changed dynamically by programming that will adjust the frequency ratio to enable use of several different data frequencies with a single predetermined servo or other reference frequency for data banding.

SUMMARY OF THE INVENTION

A method and means for setting the free-running frequency of a VCO without requiring laser trimming or the like is described. The VCO forms part of an interconnected PLL and FLL. At system power on, the PLL is automatically disabled and a DAC in the PLL is set to a value corresponding substantially to the center of a preselected lock range. Meanwhile, VCO output pulses are supplied to a first counter and reference clock pulses are supplied to a second counter. When the second counter counts to a preselected count, the then existing count in said first counter is stored in a register and both counters are reset. The stored count is then compared with a preselected expected count corresponding to said value, and a third counter is incremented or decremented according to the sign and magnitude of the difference between the stored count and expected count. This difference is transmitted to a second DAC, the current output of which is converted to a bias voltage. This voltage increments or decrements the VCO output frequency until the count in the first counter equals the expected count; whereupon the VCO will be set at its free-running frequency.

When the PLL disabling signal goes down, the PLL is enabled. A phase error generator thereafter generates a digital phase error signal from the input data. A digital integrator converts the phase error signal to a digital frequency error signal. These error signals are added and the result is supplied to the DAC in the PLL for providing an analog output indicative of PLL frequency error. The outputs from both DACs are summed and the resultant current is converted to a bais voltage to adjust the VCO frequency as necessary for normally maintaining it within said lock range.

If the VCO frequency deviates from said range, the frequency error signal to the PLL DAC is zeroed, and the frequency error signal is supplied to the FLL DAC. The phase error signal from the PLL DAC and the signal from the FLL DAC as modified by the frequency error signal are summed, and the resultant current in converted to a bias voltage to adjust the VCO frequency to within said lock range.

BRIEF DESCRIPTION OF THE DRAWING

The single FIGURE is a block diagram of a circuit embodying the invention for initially setting and thereafter dynamically adjusting the free-running frequency of a VCO.

DESCRIPTION OF THE PREFERRED EMBODIMENT

As illustrated in the drawing, the circuit embodying the invention comprises two interconnected loops A, B (shown separated by a dotted line), an eight-bit digital-to-analog converter (DAC) 10, a four-bit DAC 11, and a VCO 12. DAC 10 is set to a preselected center frequency for VCO 12, e.g., 10 MHz; and DAC 11 is set to the center of a preselected permissible deviation or lock range (e.g., ±10 KHz) from said center frequency. An analog-to-digital converter (ADC) 13, a phase error generator 14, timing control logic 15, together with the DAC 11 and VCO 12, constitute a PLL. Timing control logic 15 comprises an AND gate 16, an adder 17, a register 18, a multiplexor 20, and an adder 21.

Of these logic components, adder 17, register 18 and multiplexor 20 constitute a digital integrator 19 which, according to a feature of the invention, converts a digital phase error signal to a digital frequency error signal. The PLL timing control logic 15 controls the four-bit DAC 11 to adjust phase differences between the VCO output frequency and the data input frequency to ADC 13, so as normally to maintain the PLL within the preselected lock range. The PLL is operative to lock an output in line 22 to an analog signal supplied via an input line 23 at a desired sample phase. The output signal in 22 is used by the PLL and other parts (not shown) of a utilization device, such as a magnetic recording channel.

According to the invention, the circuit comprises a FLL in combination with the PLL. The FLL is used to initially set the free-running frequency of VCO 12 despite variation in components due process variations; and thereafter it is used to dynamically adjust the free-running frequency to maintain it within the preselected lock range of the PLL in event of drift due to relatively large changes in supply voltage and/or temperature.

The FLL comprises a line 29 for supplying servo or reference clock pulses from a source (not shown), three counters 30, 31 and 32, two comparators 33 and 34, two registers 35 and 36, a multiplexor 37, an adder 38 connected to an AND gate 39, and summing node 40, as well as the DAC 10 and VCO 12. Register 36, as well as register 18, is clocked by the VCO 12 output in line 28. Node 40 sums the currents from the DACs 10 and 11 and their sum is converted to an analog bias voltage by resistor 29.

The VCO output frequency is typically a ratio of two integers, N and R, whose values are dependent upon the servo architecture. R is the desired count of counter 31, and N is the maximum count of the reference counter 30.

OPERATION

In operation, at system power up or reset, a "set free-running frequency" signal is brought up in line 41 by programming or firmware for a preselected period of time sufficient to set the free-running frequency for VCO 12. This signal temporarily disables the PLL in the following manner. The signal in 41 is applied through an inverter 42 to AND gate 16, thereby cutting off the output from phase error generator 14 and forcing the output from AND 16 to adder 21 to zero. Meanwhile, the signal in 41 is applied via OR gate 43 to multiplexor 20 to connect the "0" input to adder 21. With both inputs to adder 21 zeroed, DAC 11 is set to zero in two's complement form at substantially the center of the preselected PLL lock range. Finally, the signal in 41 also conditions multiplexor 37 to connect counter 32 to register 36 for activating the FLL to set the free-running frequency of VCO 12.

The FLL is locked to the reference clock by counters 30, 31. The value of N is controlled by comparator 33. Each time counter 30 counts N reference clock pulses, comparator 33 issues a strobe pulse that resets counters 30, 31 and causes counter 31 to store its count of VCO pulses in register 35.

Comparator 34 is conditioned by the strobe pulse to compare the actual count M of VCO pulses as supplied to register 35 in response to the previous strobe with a preset expected count R for VCO pulses If $M < R$, the output of comparator 34 will increment counter 32; whereas if $M > R$, comparator 34 will decrement counter 32. Multiplexor 37 passes the current value of the VCO frequency from counter 32 to register 36, from which it is fed to DAC 10 and converted to a corresponding analog bias voltage. This voltage is applied via summing circuit 40 at the input to VCO 12 for causing the VCO frequency to be incremented or decremented according to whether $M < R$ or $M > R$, respectively, until the contents of register 35 equals the value of R.

VCO frequency counter 31 should count to R in the same time that the reference clock frequency counter 30 counts to N. For example, if $N=4$, $R=100$ and $M=97$, the VCO center frequency is 3 units low. The current value fed to the eight-bit DAC 10 should be incremented in increments of 1, as illustrated, to progressively raise the VCO frequency by 3 units until VCO output frequency is exactly R/N times the reference clock frequency; whereupon the VCO free-running frequency is established, and the input to the eight-bit DAC 10 will then be held constant. After this, four-bit DAC 11 takes over to compensate for phase differences between VCO output frequency and the data input frequency to ADC 13.

In practice, since the DAC 10 preselected free-running frequency and the obtainable VCO frequency will generally not be identical, a tolerance of e.g., $R \pm 2$, would be expected. It will be apparent that by increasing the value of R, the tolerance percentage can be reduced. Also, the value of the free-running frequency can be set arbitrarily close to the desired frequency depending upon the value of R and the number of bits in DAC 10.

After the initial setting of the VCO free-running frequency by the FLL, said frequency should normally be maintained by the PLL within the PLL lock range because the difference voltage derived from the phase difference should normally never exceed the range of four-bit DAC 11.

Assume now, however, that the free-running frequency runs out of the PLL normal lock range due, for example, to a significant VCO frequency drift as a result of excessive variations in temperature and/or power supply and/or aging of components. In such event, the FLL will operate dynamically to restore the VCO free-running frequency setting to within the PLL lock range in the following manner.

Phase detector 14 generates a digital signal directly proportional to the amount of drift. AND gate 16 will pass the phase error signal to adders 21, 17 because the signal in line 41 is down. When the maximum range of the digital integrator 17, 18, 20 is exceeded in either direction, adder 17 overflows or underflows. The resultant over/underflow signal passes via OR gate 43 to multiplexor 20 which then connects its "0" input adder 21. Meanwhile the phase error signal from AND 16 is converted to a digital frequency error signal as it passes via adder 17 and register 18 to AND 39. The signal bit which is of the most significant bit (MSB) in register 18 denotes whether there is an overflow or underflow condition. AND 39 is now enabled by the over/underflow signal and passes the contents of register 18 to adder 38. With line 41 down, multiplexor 37 passes the contents of adder 38 via register 36 to DAC 10. DAC 10 will generate a corresponding analog bias voltage to increase or decrease the VCO input frequency according to whether the frequency error indicated that the VCO frequency was too low or too high, thereby to adjust the VCO free-running frequency to within the PLL lock range.

Meanwhile, note that the previous VCO free-running frequency is stored in register 36; that adder 38 contains the current VCO frequency; and that this previous frequency is fed back through adder 38 and stored in register 36. Thus, the frequency count in adder 38 is continually kept current with each output from register 36 to DAC 10, as register 36 is clocked by the VCO output in line 28.

It should be noted that the ratio of the VCO frequency to the reference clock frequency can be established or modified by programming. Also different ratios and hence frequencies can be derived by suitable programming from a single servo or other reference frequency. This enables data banding, for example, in Partial Response Maximum Likelihood (PRML) and Peak Detection(PD) type magnetic recording channels.

In summary, the need for laser trimming a VCO to set the VCO free-running frequency is eliminated. This frequency is initially set by the FLL. Thereafter, the PLL is enabled and normally maintains the VCO free-running frequency within the PLL lock range. This frequency is readjusted if and when the PLL exceeds its lock range, as determined by the digital integrator 17, 18, 20. As a result, the VCO free-running frequency is maintained within the PLL lock range.

While the invention has been shown and described with reference to a preferred embodiment thereof, it will be understood by hose skilled in the art that various changes in form and detail may be made without departing from the spirit and scope of the invention. Accordingly, the invention is not to be deemed limited except as specified in the claims.

What is claimed is:

1. A method for setting the free-running frequency of a VCO that forms part of a PLL comprising the steps of:
   at system power on, disabling the PLL and setting a DAC and the PLL to a value corresponding substantially to the center of a preselected frequency lock range;
   supplying the VCO output pulses to a first counter;
   supplying pulses from a reference clock to a second counter;
   when the second counter counts to a preselected count, storing the count then in said first counter in a register and resetting both counters;
   comparing the stored count with a preselected expected count corresponding to said value; and
   incrementing or decrementing the VCO frequency according to whether the stored count is lower or higher than the expected count.

2. The method of claim 1, wherein the incrementing-/decrementing step includes:
   incrementing or decrementing a third counter according to the sign and magnitude of the difference between said stored count and expected count determined during the comparing step; and
   transmitting said difference to a second DAC to voltage bias the VCO in one or more steps until the count in the register equals said expected count and the VCO is thereby set at its free-running frequency.

3. The method of claim 1, including the steps of:
   enabling the PLL;
   providing as part of the PLL, a digital integrator for converting a digital signal indicative of phase error magnitude to a digital signal indicative of frequency error magnitude; and
   dynamically adjusting the free-running frequency to within said preselected range when the frequency error magnitude of the PLL deviates from said preselected range.

4. The method of claim 1, wherein the VCO free-running frequency is reset automatically each time system power is turned on.

5. A method of maintaining the free-running frequency of a VCO in a PLL within a preselected lock range, comprising the steps of:
   (1) disabling the PLL and while disabled
      (a) setting the free-running frequency into one DAC for providing an analog output indicative thereof;
   (2) enabling the PLL and
      (a) generating a digital phase error signal; digital frequency error signal;
      (c) adding said phase error and frequency error signals and supplying the result to another DAC for providing an analog output reflecting PLL frequency error; and
      (d) summing said outputs to produce a bias voltage to adjust the VCO frequency as necessary for normally maintaining it within said lock range.

6. The method of claim 5, including the steps:
   if the VCO frequency deviates from said range, of dynamically adjusting said frequency by zeroing the frequency error signal to said second DAC but not the phase error signal; and
   supplying the frequency error signal to said one DAC; and
   summing the outputs of said DACs for causing a bias voltage to developed for adjusting the VCO frequency to within said lock range.

7. In an apparatus for setting the free-running frequency of a VCO in a PLL;
   a DAC in the PLL set substantially to the center of a preselected frequency lock range;
   a first counter for counting output frequency pulses of the VCO;
   a second counter for counting frequency pulses from a reference clock and providing a strobe pulse upon counting to a preselected count;
   a register in which the then existing count in said first counter is stored in response to the strobe pulse;
   a comparator conditioned by said strobe pulse for comparing the count stored in the register with a preselected expected count for providing an output when the stored and expected counts differ.

8. In the apparatus of claim 7:
   means including another DAC responsive to said output to increment or decrement the VCO output frequency for adjusting it toward its preselected free-running frequency.

9. Apparatus for setting the free-running frequency of a VCO forming part of an interconnected PLL ad FLL, said apparatus comprising:
   a DAC in the PLL;
   means for setting the DAC substantially to the center of a preselected frequency lock range;
   said FLL comprising
   a first counter for counting output pulses of the VCO;

a second counter for counting pulses from a reference clock and providing a strobe pulse upon counting to a preselected count;

a register in which the then existing count in said first counter is stored in response to the strobe pulse;

a comparator conditioned by said strobe pulse for comparing the count stored in the register with a preselected expected count for providing an output when the stored and expected counts differ; and means including a third counter and another DAC, responsive to said output to increment or decrement the VCO output frequency for adjusting it toward its free-running frequency.

10. The apparatus of claim 9, including:

a digital integrator in the PLL for converting a digital signal indicative of phase error magnitude to a digital signal indicative of frequency error magnitude; and means including said integrator responsive to a frequency error magnitude exceeding said lock range to dynamically adjust the free-running frequency to within said preselected range.

11. The apparatus of claim 9, including means responsive to a signal which is active for a predetermined period of time each time system power is turned on to condition the apparatus to set the free-running frequency.

12. Apparatus for maintaining the free-running frequency of a VCO in a PLL within a preselected lock range, comprising:

two DACs;

means for setting the free-running frequency into one of said DACs for providing an analog output indicative thereof;

means for generating a digital phase error signal;

means for converting the phase error signal to a digital frequency error signal;

means for adding said phase error and frequency error signals and supplying the result to the other of said DACs for providing an analog output reflecting the PLL frequency error; and means, including means for summing said outputs, to provide a bias voltage to adjust the VCO frequency as necessary for normally maintaining it within said lock range.

13. The apparatus of claim 12, including:

means responsive to a deviation in the VCO frequency from said range to zero the frequency error signal to said other DAC but not the phase error signal thereto;

means for supplying the frequency error signal to said one DAC; and means including means for summing the outputs of said DACs for providing a bias voltage to adjust the VCO frequency to within said lock range.

* * * * *

UNITED STATES PATENT AND TRADEMARK OFFICE
CERTIFICATE OF CORRECTION

PATENT NO.   : 4,929,918

DATED        : May 29, 1990

INVENTOR(S)  : P. W. Chung et al

It is certified that error appears in the above-identified patent and that said Letters Patent is hereby corrected as shown below:

Column 5, line 44, delete "and", insert --in--

Column 6, line 22, after "signal;", insert --(b) converting the phase error signal to a--

Column 7, line 11, delete "means", insert --means,--

Signed and Sealed this

Seventeenth Day of September, 1991

*Attest:*

HARRY F. MANBECK, JR.

*Attesting Officer*     *Commissioner of Patents and Trademarks*